US009123404B2

(12) United States Patent
Swoboda (10) Patent No.: US 9,123,404 B2
(45) Date of Patent: Sep. 1, 2015

(54) SELF CLOCKING FOR DATA EXTRACTION (71) Applicant: TEXAS INSTRUMENTS INCORPORATED, Dallas, TX (US)

(72) Inventor: Gary L Swoboda, Sugar Land, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 413 days.

(21) Appl. No.: 13/738,645

(22) Filed: Jan. 10, 2013

(65) Prior Publication Data
US 2013/0176809 A1 Jul. 11, 2013

Related U.S. Application Data (60) Provisional application No. 61/584,950, filed on Jan. 10, 2012.

(51) Int. Cl.
*G11C 8/18* (2006.01)
*G11C 7/22* (2006.01)
*G11C 7/00* (2006.01)
*G11C 29/00* (2006.01)
*G11C 7/10* (2006.01)

(52) U.S. Cl.
CPC .. *G11C 8/18* (2013.01); *G11C 7/00* (2013.01); *G11C 7/1093* (2013.01); *G11C 7/22* (2013.01); *G11C 29/00* (2013.01)

(58) Field of Classification Search
CPC ............. G11C 8/18; G11C 7/00; G11C 7/22; G11C 7/1093; G11C 19/00; G11C 29/04
USPC .................. 365/233.13, 185.22, 189.05, 233; 375/355, 359, 360, 371
See application file for complete search history.

(56) References Cited

U.S. PATENT DOCUMENTS

| | | | | |
|---|---|---|---|---|
| 5,504,751 A * | 4/1996 | Ledzius et al. | ................ | 341/144 |
| 6,570,945 B1 * | 5/2003 | Ono et al. | ...................... | 375/359 |
| 6,683,927 B1 * | 1/2004 | Ito | .................... | 375/355 |
| 7,123,673 B2 * | 10/2006 | Czekaj et al. | ................ | 375/350 |
| 7,321,647 B2 * | 1/2008 | Matsuura | ....................... | 375/355 |
| 7,342,986 B2 * | 3/2008 | Nakamura et al. | ............ | 375/376 |

* cited by examiner

*Primary Examiner* — Gene Auduong
(74) *Attorney, Agent, or Firm* — Lawrence J. Bassuk; Frank D. Cimino (57) ABSTRACT

A self clocking data extraction method is shown that is tolerant of timing jitter, data skew and the presence of multiple edges per data bit. The data is sampled when the following criterion are met: There is at least one edge across any track (the clock assures this criteria is met), followed by no edges in any track for a defined period of time (T), and all edge activity must occur in a period of time less than T (to keep from detecting false samples). This method enables the handling of trace data signals with poor electrical characteristics that can not be recorded by methods known in the prior art.

13 Claims, 7 Drawing Sheets

Data Extraction Hardware

Figure 7 – Data Extraction Hardware

SELF CLOCKING FOR DATA EXTRACTION

CLAIM OF PRIORITY

This application claims priority under 35 U.S.C. 119(e)(1) to U.S. Provisional Application No. 61/584,950 filed Jan. 10, 2012.

TECHNICAL FIELD OF THE INVENTION

The technical field of this invention is self clocking data extraction.

BACKGROUND OF THE INVENTION

In a system where data is transferred from point A to point B using Double Data Rate (DDR) format, and signal quality is diminished by signal modulation, transmission line effects, and/or signal coupling, it may be difficult or impossible to transfer data reliably using conventional DDR data extraction schemes. One such environment is trace data collection within development systems. Often the electrical characteristics of the data path are compromised by poor board layout (transmission line stubs or impedance out of spec), missmatch of driver, transmission line, connector impedances, or signal coupling. These systems provide a harsh environment for reliable data extraction.

SUMMARY OF THE INVENTION

A self clocking data extraction method is shown that is more tolerant of timing jitter, data skew and the presence of multiple edges per data bit. This invention enables the handling of trace data signals with poor electrical characteristics that cannot be recorded by methods known in the prior art.

BRIEF DESCRIPTION OF THE DRAWINGS

These and other aspects of this invention are illustrated in the drawings, in which.

DETAILED DESCRIPTION OF PREFERRED EMBODIMENTS

Historically DDR data extraction relies on excellent=signal quality, constant or near constant skew between signals, and in some cases auto calibration which places data strobes at the optimal position in bit periods. Extraction becomes unreliable when signals transition multiple times within a bit period or have skew which is changes over one or more bit periods.

Figure 1:
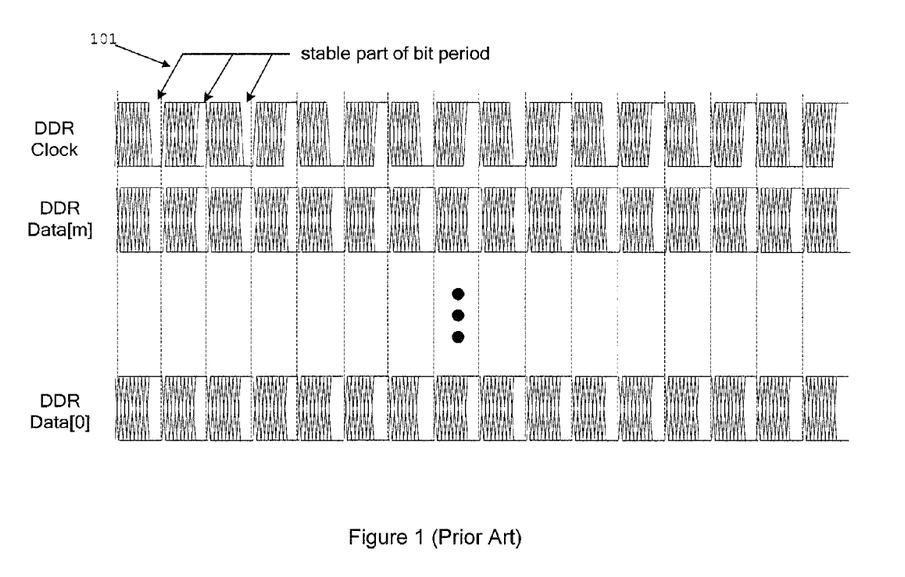
FIG. 1 shows poorly implemented DDR signaling.

In a poorly implemented system, the DDR signaling may look like that shown in FIG. 1. Further some of these signals may be skewed in relation to each other (not shown in the figure).

Figure 2:
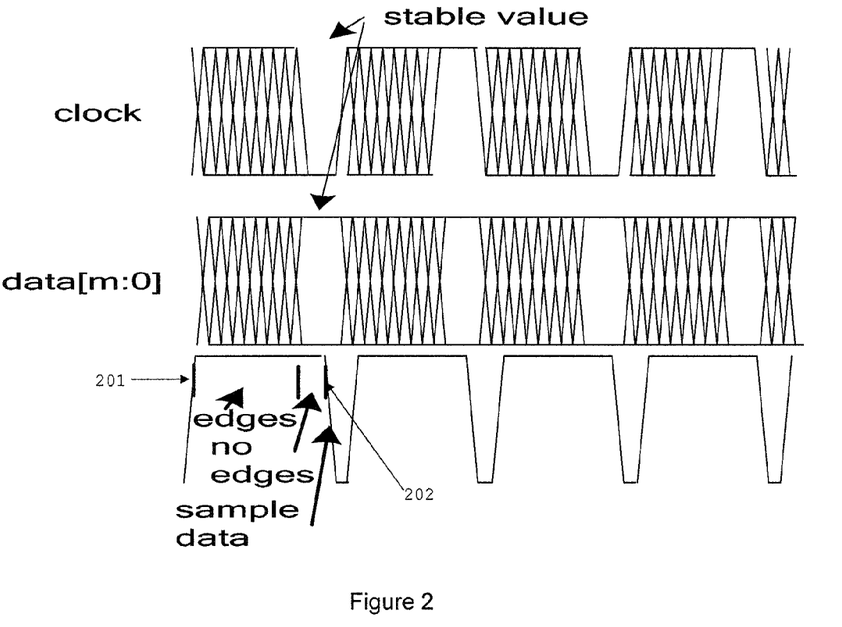
FIG. 2 shows DDR data extraction in the prior art.

A common characteristic of the poor signaling shown in FIG. 1 is that both the clock and data signals reach a stable value 101 at some point (generally towards the end of the bit period). This characteristic together the fact that the clock will have at least one edge during a bit period enables the use the following data extraction criteria. The data is sampled when the following criterion is met:

There is at least one edge 201 across any track (the clock assures this criteria is met) followed by There are no edges 202 in any track for a defined period of time Y.

All edge activity must occur in a period of time less than T (to keep from detecting false samples)

This is shown in FIG. 2.

Figure 3:
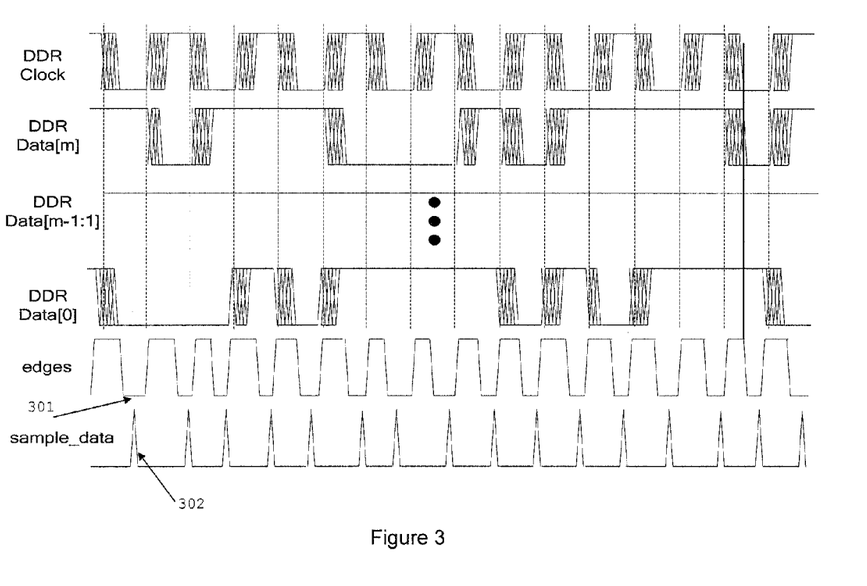
FIG. 3 shows the timing variations in DDR signaling.

Note that the sampling point 301 can vary dramatically from bit to bit depending on the skew of the signals, the signals that do not change, or dynamic changes induced in edge position (those induced by ground and power supply fluctuations or other phenomenon). This is illustrated in FIG. 3. Note the following:

The skew between DDR Data[n] and DDR Data[0];

The operation when no data bits change; and

The changes in the position of sample_data 302.

Two types of implementations are described in the following paragraphs:

Oversampled data is created synchronous to the bit period; and

Oversampled data is created asynchronous to the bit period.

Either version may be implemented with oversampling created with either clocked oversampling or oversampled values created with a combination of registers and delay lines.

Figure 4:
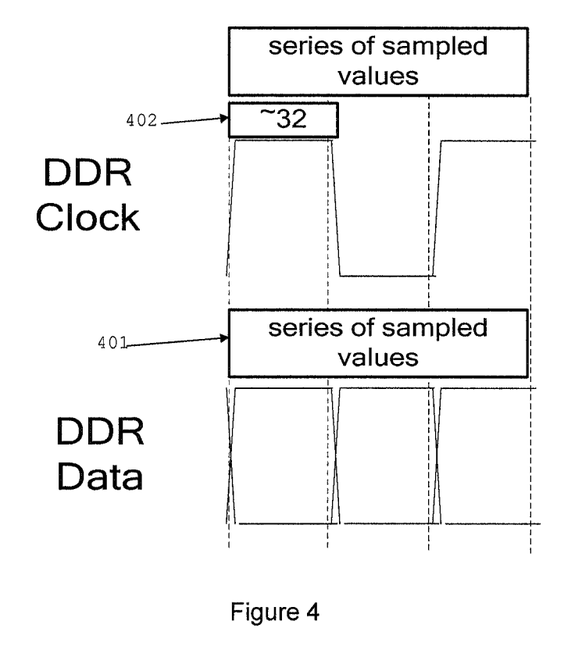
FIG. 4 shows oversampled data synchronous to the bit period.

A digital view of the incoming signals over time is created as shown in FIG. 4 with the series of sampled values 401 either synchronous or asynchronous to the incoming data's bit period.

Figure 5:
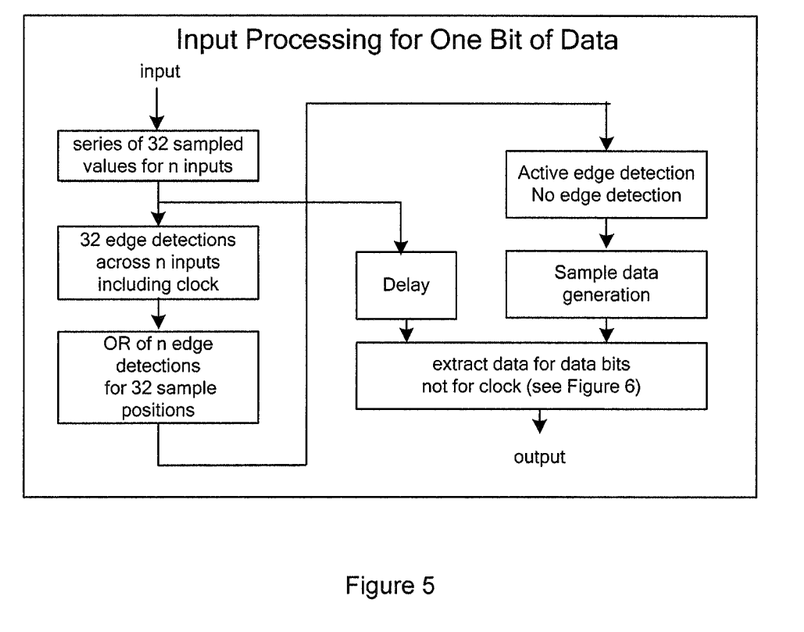
FIG. 5 illustrates the edge detection used in the invention.

In example one, sampled data is created synchronous to the bit period of the incoming data. In this example 32 samples 402 are exactly one bit period. The choice of a 32 samples in a group is arbitrary and can be different. For each group of 32 samples, samples n and n+1 are compared with a difference in these values defining a signal edge (change in state). When jitter is considered, no more than two data bits can be extracted from any group of 32 samples. Thirty-three 33 samples (32 of the current group+the last sample of the prior group) are used to detect edges. The edge detection method is used as shown in FIG. 5.

The extract data hardware identifies the bits in the series of sampled values of each channel that are to be used as data. Sample_data[15:00] is used to extract data in Window A while sample data[31:16] is used to extract data in Window B. The sampled data[n] is Logically ANDed with delayed versions of the sample value[n]. The ANDed results[15:00] are logically ORed to create the extracted data in Window A. Likewise the ANDed results[31:16] are logically ORed to create the extracted data in Window B.

There are four possibilities each clock period:

Window A and Window B both produce data bits (data[m]= DB, DA;

Window A produces a data bit/Window B produces no data bit (data[m]=NULL, DA);

Window A produces a data bit/Window B produces no data bit (data[m]=NULL, DB); and Window A and Window B produce no data bits (data [m]=NULL, NULL)

Figure 6:
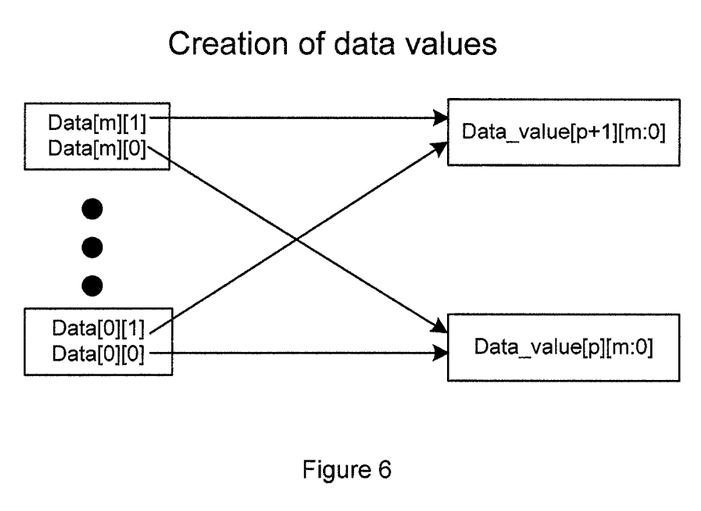
FIG. 6 shows the creation of the data values.

The number of data values produced is two when sample_data[15:00] is non-zero and sample_data[31:16] is non-zero. If only one of these values is non-zero then only one data bit is produced. When both are zero no data is produced. A data value is created by stacking the extracted data bits as shown in FIG. 6.

In another example we will group 32 samples to demonstrate DDR extraction with an unknown bit period. The 32 samples are divided into four windows of 8 samples for data extraction purposes. The sample period must be high enough to assure that only one sample data value falls into a window at all times. In this example this requires the eight or more samples per incoming bit period. Oversampled data sample positions m and m+1 are compared with a difference defining an edge. Thirty-three 33 samples (32 of the current samples+ the last sample of the prior group) are used to detect edges.

Again the choice of a 32 samples in a group is arbitrary and the number of samples per window can be different. This implementation operates in the same manner as when the bit period is known, but with zero to four data values created from each group of 32 samples. Data extraction using sample_data is handled as follows:

Sample_data[07:00] is used to extract data in Window A;
Sample_data[15:08] is used to extract data in Window B;
Sample_data[23:16] is used to extract data in Window C; and
Sample_data[31:24] is used to extract data in Window D.

The data extraction step logically ANDs the sample_data [n] with delayed versions of the sample value[n] within a window. The ANDed results are logically ORed to create the extracted data within this window.

The extraction with non-DDR data can be done in the same manner as DDR data by qualifying the generation by a logic 0 clock value when data is to be sampled on this clock edge and by a logic 1 value when data is to be sampled on this clock edge.

Figure 7:
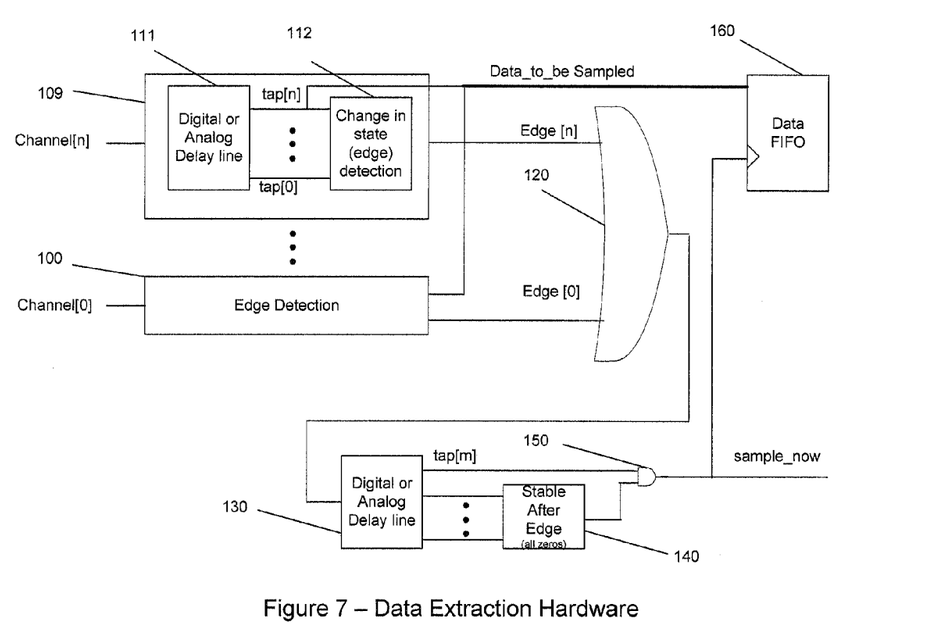
FIG. 7 illustrates an apparatus constructed to practice this invention.

FIG. 7 is a block diagram of an apparatus practicing this invention. Plural edge detectors 100 to 109 service corresponding input signals on channel[0] to channel[n].

Representative edge detector 109 is shown as including delay line 111 which can be digital or analog and produces a plurality of delayed signals on tap[0] to tap[n]. Change in state detector 112 detects edges in the corresponding input channel. This is supplied to OR gate 120 as the edge[n] signal. OR gate 120 receives such an edge signal for each input channel.

The output of OR gate 120 drives delay line 130. Delay line 130 produces a plurality of delayed signals including tap[m]. Stable detector 140 determines when a predetermined number of stable states occurs. AND gate 150 receives the tap[m] signal from delay line 130 and the stability signal stable detector 140. The output of AND gate 150 is the sample_now signal. Data FIFO acquires the corresponding signal from each edge detector 100 to 109 upon occurrence of the sample_now signal.

What is claimed is:

1. A method of data extraction of data in a plurality of signal channels, comprising the steps of:
   for each signal channel taking a group of samples distributed throughout a bit period interval;
   for each signal channel comparing each sample of said group of samples with a prior sample
      determining an edge in said signal channel at said sample if said sample differs from said prior sample, and
      determining no edge in said signal channel at said sample if said sample equals said prior sample;
   extracting data from all signal channels at a sample of said group of samples following detection of
      (1) a sample during which an edge is determined in at least one signal channel, followed by
      (2) a second predetermined time Y during which no edge is determined for any signal channel.

2. The method of claim 1, wherein:
said first predetermined time X is a first number of sampled of said group of samples.

3. The method of claim 1, wherein:
said second predetermined time Y is a second number of sampled of said group of samples.

4. The method of claim 1, wherein:
said group of samples is m samples n through n+m−1;
sample data [(m/2)−1:00] is used to extract data within a window A; an
sample data [m−1; m/2] is used to extract data within a window B.

5. The method of claim 4, wherein:
the extracted data in window A is created by
   calculating the logical AND of data [n] with a delayed version of sample value [n], and
   calculating the logical OR of the AND results [15:00] resulting in the extracted data in window A.

6. The method of claim 4, wherein:
the extracted data in window B is created by
   calculating the logical AND of data [n] with a delayed version of sample value [n], and
   calculating the logical OR of the AND results [m−1:m/2] resulting in the extracted data in window B.

7. The method of claim 1 wherein:
sample data [(m/2)−1:00] is used to extract data in window A; and
sample data [m−1:m/2] is used to extract data in window B.

8. The method of claim 1, wherein:
sample data [(m/4)−1:00] is used to extract data in window A;
sample data [(m/2)−1:(m/4)] is used to extract data in window B;
sample data [(3m/4)−1:m/2] is used to extract data in window C; and
sample data [m−1:(3m/4)] is used to extract data in window D.

9. The method of claim 8 wherein:
the extracted data in window A is created by:
   calculating the logical AND of data [n] with a delayed version of sample value [n], and
   calculating the logical OR of the AND results [(m/4)−1:00] resulting in the extracted data in window A.

10. The method of claim 1 wherein:
the extracted data in window B is created by:
   calculating the logical AND of data [n] with a delayed version of sample value [n], and
   calculating the logical OR of the AND results [(m/2)−1:(m/4)] resulting in the extracted data in window B.

11. The method of claim 1 wherein:
the extracted data in window C is created by:
   calculating the logical AND of data [n] with a delayed version of sample value [n], and
   calculating the logical OR of the AND results [(3m/4)−1:m/2] resulting in the extracted data in window C.

12. The method of claim 1 wherein:
the extracted data in window D is created by:
   calculating the logical AND of data [n] with a delayed version of sample value [n], and
   calculating the logical OR of the AND results [m−1:(3m/4)]resulting in the extracted data in window D.

13. A data extraction apparatus comprising:
a plurality of input channels, each input operable to receive a corresponding signal input;
a plurality of sampling circuits, one sampling circuit on each input channel to sample the corresponding signal input throughout a bit period interval;
a plurality of edge detection circuits, one edge detection circuit for each sampling circuit, each edge detecting circuit
- determining an edge in said corresponding signal input at a sample if a current sample differs from said prior sample, and
- determining no edge in said signal input at a sample if said current sample equals said prior sample;

a plurality of edge detection circuits, one edge detection circuit for each sampling circuit, each edge detection circuit extracting data from said corresponding signal input at a sample of said group of samples following detection of
- (1) a sample during which an edge is determined in at least one signal channel, followed by
- (2) a second predetermined time Y during which no edge is determined for any signal channel.

* * * * *